United States Patent [19]

Filipski et al.

[11] Patent Number: 5,015,832

[45] Date of Patent: May 14, 1991

[54] METHOD OF AND APPARATUS FOR DECODING BAR CODE SYMBOLS

[75] Inventors: Paul S. Filipski; Paul E. Bacchi, both of Novato, Calif.

[73] Assignee: Kensington Laboratories, Inc., Richmond, Calif.

[21] Appl. No.: 317,227

[22] Filed: Feb. 27, 1989

[51] Int. Cl.⁵ .............................................. G06K 7/10
[52] U.S. Cl. .................................... 235/462; 235/464; 235/375
[58] Field of Search ............... 235/462, 464, 375, 463, 235/454, 472; 250/566, 68

[56] References Cited

U.S. PATENT DOCUMENTS

| | | | |
|---|---|---|---|
| 4,010,355 | 3/1977 | Roehrman et al. | 235/462 |
| 4,166,574 | 9/1979 | Yokoyama | 235/464 X |
| 4,276,470 | 6/1981 | Rady et al. | 235/463 |
| 4,585,931 | 4/1986 | Duncan et al. | 235/464 |
| 4,675,531 | 6/1987 | Clark et al. | 235/472 X |
| 4,751,375 | 6/1988 | Ravizza | 235/472 |
| 4,774,400 | 9/1988 | Kimura | 235/454 |
| 4,794,238 | 12/1988 | Hampton | 235/462 |
| 4,825,093 | 4/1989 | Kiriseko et al. | 235/462 X |

Primary Examiner—Stuart S. Levy
Assistant Examiner—Steven M. du Bois
Attorney, Agent, or Firm—Stoel, Rives, Boley, Jones & Grey

[57] ABSTRACT

A method and an apparatus scan a light beam (62) along an arcuate scan path (148 and 150) across a bar code symbol (48) to decode it. In a preferred embodiment, a robotic semiconductor wafer handler (10) rotates a fixed-beam optical scanning assembly (44) beneath the bar code symbol inscribed in and near the periphery of the bottom surface (50) of a stationary semiconductor wafer (12). The rotation of the optical scanning assembly is characterized as a series of angular positions. The bar code symbol is decoded by determining the angular position of each of the bars of the bar code symbol during the rotation of the optical scanning assembly. A microprocessor-based scan data processing system (60) included within the wafer handler carries out a decoding algorithm to determine the distances between adjacent bars, thereby to decode the bar code symbol.

14 Claims, 3 Drawing Sheets

FIG. 2
FIG. 1
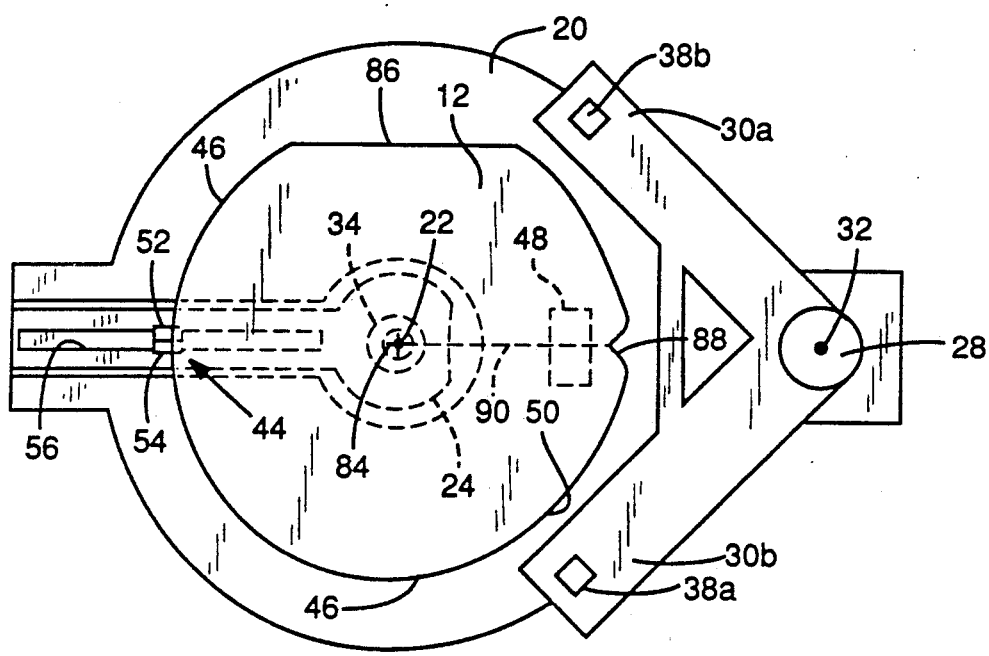
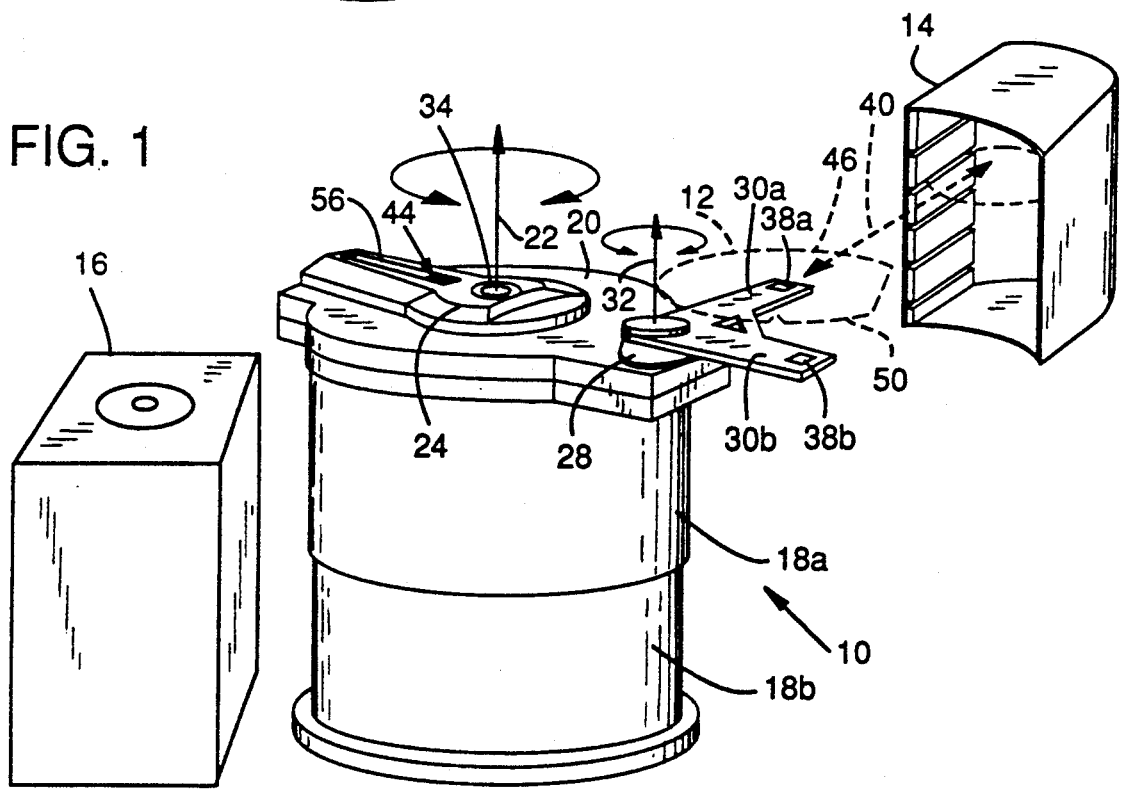

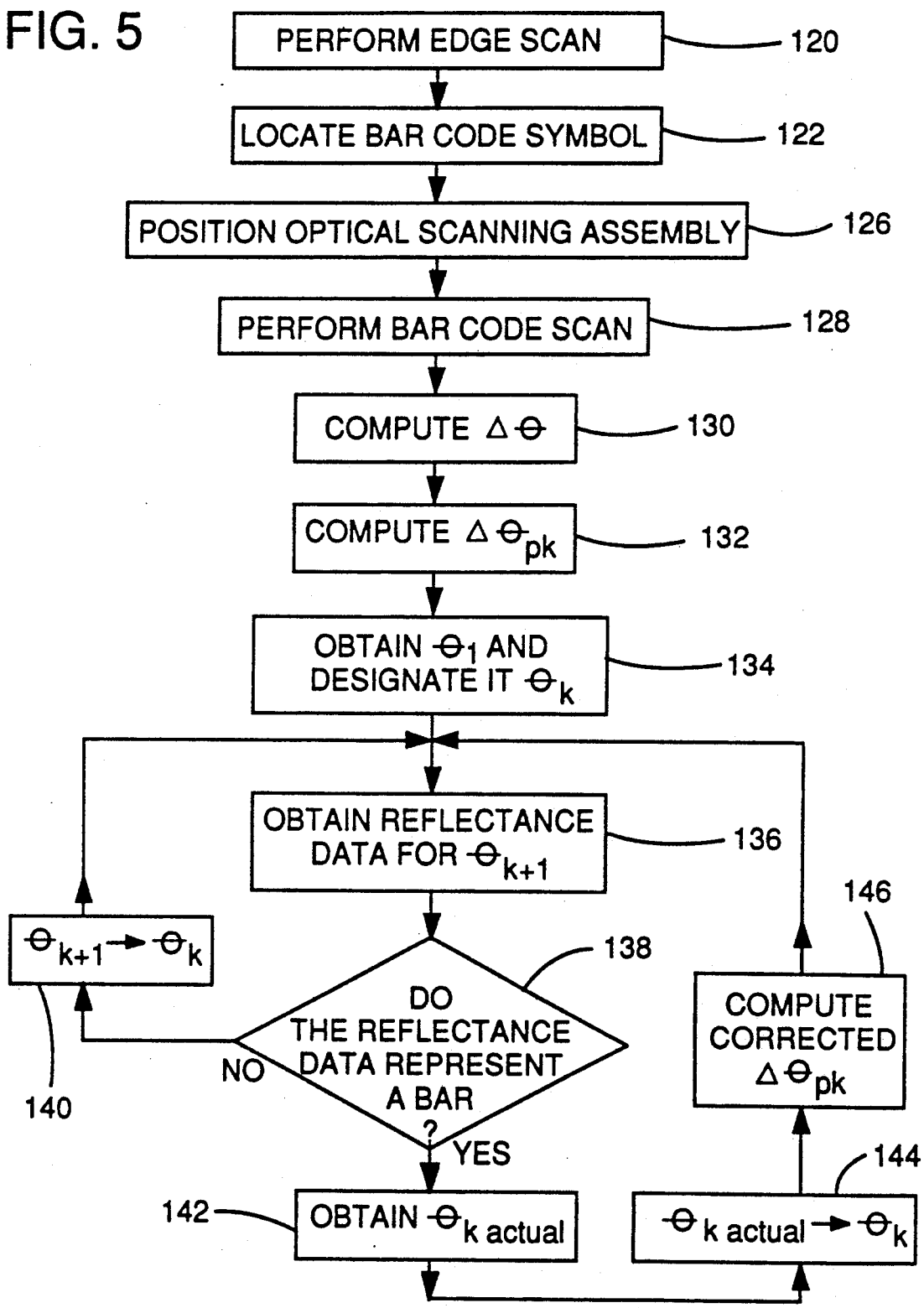

METHOD OF AND APPARATUS FOR DECODING BAR CODE SYMBOLS

TECHNICAL FIELD

The present invention relates to bar code symbol decoding systems and, in particular, to a method and an apparatus that scans a light beam along an arcuate scan path across a bar code symbol to decode it.

BACKGROUND OF THE INVENTION

A bar code symbol comprises a series of nominally equal length, parallel bar code lines (hereinafter "bars") spaced apart and positioned in perpendicular relation to a linear axis. In most bar code formats, a bar code symbol is characterized by bars of nonuniform widths and next adjacent bars of nonuniform spacings between them. The widths of the bars are integer multiples of predetermined unit widths, and the spacings between the next adjacent bars are integer multiples of predetermined unit spaces. The bars and the spaces between them represent contrasting binary symbol components (e.g., dark and light, respectively) that are indicative of a self-contained message, which is read by a bar code scanner.

A conventional bar code scanner decodes or "reads" a bar code symbol by passing a light beam along a straight-line scan path across the symbol and detecting the intensity of light reflected by the symbol. The light reflected by the bar code symbol is intensity modulated in accordance with the sequence of contrasting bars and spaces between them. The bar code scanner determines from the reflected, intensity-modulated light the relative widths of the bars and spaces in the bar code symbol, and thereby reads the message contained therein. Conventional bar code scanners typically are of the fixed-beam scanner type such as wands, slot readers, or non-contact scanners, or are of the moving-beam scanner type such as handheld laser scanners or fixed-mount laser scanners.

A bar code symbol of the type described above heretofore had to be scanned along a straight-line path because a change in the direction of a scan path introduces a consequent change in the relative widths of the bars and spaces detected by the bar code scanner. For example, a scan path that departs from a nominal straight-line path by an angle $\theta$ within the bar code region changes the detected relative widths of the bars and spaces by a factor $(\cos \theta)^{-1}$. Such a change in detected relative widths of bars and spaces could cause an erroneous reading of a bar code symbol.

One type of conventional bar code scanner must scan the light beam across the bar code symbol at a constant scan speed because a change in the scan speed also introduces a consequent change in the relative widths of the bars and spaces detected by the bar code scanner. For example, an increase in the scan speed that occurs within the bar code region causes a corresponding reduction in the detected relative widths of the bars and spaces. As in the case of a change in scan path direction, a change in the scan speed could also cause an erroneous reading of a bar code symbol. A conventional bar code scanner is, therefore, capable of accurately reading a bar code symbol only if the light beam is scanned across the bar code symbol at a constant velocity, i.e., at constant speed and in an unchanging direction.

Moving-beam scanners inherently achieve straight-line scan paths, but fixed-beam scanners achieve straight-line scan paths by providing straight-line motion between the bar code symbol and the scanner. Straight-line motion may be provided, for example, by an operator manually passing a wand over a bar code symbol or by mechanically transporting the bar code symbol past the scanner.

Certain types of mechanical transport systems employ, however, rotational motion, which, if used to read a bar code symbol, would form an arcuate scan path across a bar code symbol positioned on a planar surface. Such a scan path would be incompatible with a conventional bar code scanner because such a scan path causes the detected relative widths of bars and spaces to change continuously, thereby introducing varying amounts of error throughout the scan of the bar code symbol.

SUMMARY OF THE INVENTION

An object of the present invention is, therefore, to provide a method for decoding a bar code symbol.

Another object of this invention is to provide such a method in which a light beam is scanned across a bar code symbol along an arcuate scan path.

A further object of this invention is to provide such a method in which a mechanical transport apparatus cooperates with a fixed-beam scanner to scan a light beam along an arcuate scan path.

Still another object of this invention is to provide an apparatus for decoding a bar code symbol in accordance with the above-described method.

The present invention is a method and an apparatus that scans a light beam along an arcuate scan path across the bar code symbol to decode it. In a preferred embodiment, a robotic semiconductor wafer handler rotates a fixed-beam optical scanning assembly beneath a bar code symbol inscribed in and near the periphery of the bottom surface of a stationary semiconductor wafer. The optical scanning assembly includes a light source that is rotated about a central axis to angularly displace the light source across the bar code symbol. The light source forms a light beam, and the rotation of the light source forms an arcuate scan path across the bar code symbol, which reflects the light toward a light sensor that measures the amount of reflected light at any given angular position of the light beam.

The bar code symbol inscribed in the bottom surface of the wafer comprises a series of bars of equal length and of uniform width. Adjacent bars of the bar code symbol are spaced apart from each other by an integer multiple of a unit distance. The number of unit distances between adjacent bars characterizes the symbol to be decoded.

In a preferred embodiment, decoding the bar code symbol is achieved by sequentially performing an edge scan and a bar code scan of the wafer. The edge scan creates a polar map of the periphery of the wafer. The edge scan polar map provides the angular positions of the wafer features, such as the notch or flat portions, relative to a reference location. The bar code scan creates a polar map of the bar code symbol. The bar code polar map provides the angular displacement within which the bar code symbol is positioned and the angular position of each of the bars of the bar code symbol. Each of the bars represents a point of low reflectance in the bar code polar map.

A microprocessor-based scan data processing system included within the wafer handler carries out a decoding algorithm to determine the distances between adjacent bars to decode the bar code symbol. The algorithm uses the edge scan and bar code scan polar map data to provide an accurate estimate of the number of unit distances between adjacent bars of the bar code symbol. The algorithm is effective irrespective of whether the wafer is centered on the central axis of the wafer handler about which axis the light beam rotates.

The bar code scanner of this invention correlates data acquired during the edge scan and bar code scan to the format specifications of the bar code type being read. As a result, the present invention is capable of decoding a bar code symbol by means of an arcuate scan path that is compatible with a part handler employing rotational motion.

Additional objects and advantages of the present invention will be apparent from the following detailed description of a preferred embodiment thereof, which proceeds with reference to the accompanying drawings.

BRIEF DESCRIPTION OF THE DRAWINGS

FIG. 1 is a diagram of an exemplary robotic semiconductor wafer handler employing a bar code scanning apparatus of the present invention.

FIG. 2 is a plan view of a semiconductor wafer positioned on a specimen handling platform of the wafer handler of FIG. 1.

FIG. 5 is a flow diagram showing the process for decoding a bar code symbol of the type shown in FIG. 4.

DETAILED DESCRIPTION OF PREFERRED EMBODIMENT

Figure 3:
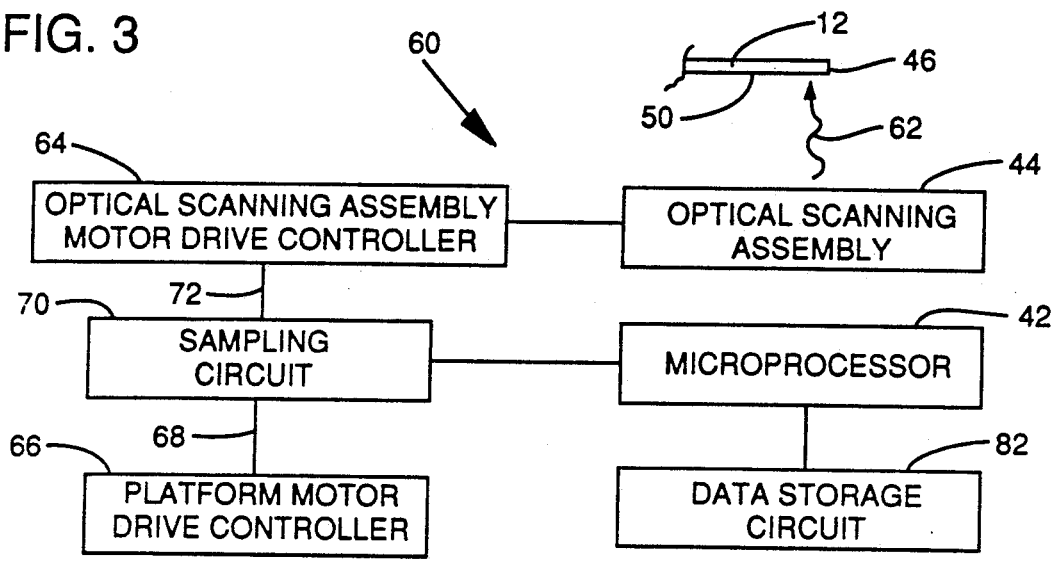
FIG. 3 is a simplified block diagram of a scan data processing system and associated optical scanning assembly that function as the bar code scanning apparatus.

FIG. 1 is a diagram of a robotic semiconductor wafer handler 10 for transporting a semiconductor wafer 12 (shown in phantom) between, for example, a wafer storage cassette 14 and a wafer test apparatus 16 employed in an integrated circuit manufacturing facility. Wafer handler 10 is of the type manufactured by Kensington Laboratories, Inc. of Richmond, Calif.

Wafer handler 10 includes a top cylinder 18a that is concentric with and overlaps a base cylinder 18b. Top cylinder 18a carries a specimen handling platform 20 on its top side. Top cylinder 18a, together with platform 20, is rotatable about and movable along a central axis 22. Wafer handler 10 is characterized, therefore, as having a "waist" between cylinders 18a and 18b.

Platform 20 includes a nonrotatable central pedestal 24 that is axially aligned with and movable along central axis 22. A wafer paddle pedestal 28 positioned near the periphery of platform 20 supports a pair of wafer paddles 30a and 30b. Paddles 30a and 30b are rotatable on wafer paddle pedestal 28 about a paddle axis 32, which is substantially parallel to central axis 22.

Central pedestal 24 includes a central vacuum chuck 34 that is axially aligned with central axis 22. A microprocessor-controlled drive mechanism (not shown) included within wafer handler 10 coordinates the rotation of platform 20 about central axis 22 and the rotation of paddles 30a and 30b about paddle axis 32 to achieve the desired movement for transporting wafer 12 between cassette 14 and test apparatus 16.

For example, wafer handler 10 acquires semiconductor wafer 12 from storage cassette 14 by positioning wafer paddle 30a beneath the wafer. Platform 20 is then moved upward by extending cylinder 18a along axis 22 so that paddle 30a engages wafer 12. Vacuum pressure applied to a vacuum chuck 38a in paddle 30a secures wafer 12 to the paddle. Wafer handler 10 moves wafer 12 along a straight-line path 40 from storage cassette 14.

A microprocessor circuit 42 (FIG. 3) controls the drive mechanism that rotates platform 20 about central axis 22 and wafer paddle 30a about axis 32 to form the straight-line path 40. Straight-line path 40 can be achieved, for example, by rotating platform 20 in a clockwise direction while rotating paddle 30a in a counter-clockwise direction at preselected angular speeds.

After it is removed from storage cassette 14 along straight-line path 40, wafer 12 is rotated about paddle axis 32 and positioned over central pedestal 24. Wafer 12 is transferred from wafer paddle 30a to central vacuum chuck 34 by the coordinated release of vacuum pressure to vacuum chuck 38a and application of vacuum pressure to vacuum chuck 34. Since it is able to transport wafer 12 along a straight-line path, wafer handler 10 is compatible for use with standard wafer storage cassettes and processing equipment employed in integrated circuit manufacturing facilities.

One of the tasks wafer handler 10 performs is an edge scan operation to obtain a polar map of the periphery of wafer 12. The polar map data are manipulated in accordance with appropriate algorithms to compute the center and orientation of wafer 12. More specifically, wafer handler 10 performs the edge scan by rotating an optical scanning assembly 44 on platform 20 about the perimeter 46 of wafer 12. Upon completion of the edge scan, wafer handler 10 computes the position and orientation of wafer 12. Wafer handler 10 performs a second scan to read a bar code symbol 48 (outlined in phantom) positioned on the bottom major surface 50 of wafer 12, as will be described in greater detail below. Wafer handler 10 uses paddle 30a to center and orient wafer 12 so that it can be positioned properly on test apparatus 16.

FIG. 2 is a plan view of platform 20 with wafer 12 secured to central vacuum chuck 34. Wafer handler 10 performs an edge scan of wafer 12 by rotating optical scanning assembly 44 about the perimeter 46 of wafer 12, which is held in a fixed position by central vacuum chuck 34. Optical scanning assembly 44 includes a light emitting means or diode 52 and an adjacent photodetector 54 that travel along a rack gear (not shown) positioned beneath a slot 56 in platform 20. Slot 56 extends radially from central axis 22 toward the side of platform 20 opposite the side on which paddle pedestal 28 is positioned.

FIG. 3 is a simplified block diagram of a scan data processing system 60 that cooperates with optical scanning assembly 44 to compute the position and orientation of wafer 12. During the edge scan of wafer 12, light emitting diode 52 of optical scanning assembly 44 directs a light beam 62 of a previously measured maximum intensity toward bottom surface 50 of wafer 12.

Whenever optical scanning assembly 44 is positioned along slot 56 at a radial distance less than that of perimeter 46, substantially all of light beam 62 is reflected toward photodetector 54, which delivers a position feedback signal in a LIGHT state to a scanning assembly motor drive controller 64. In response to the position feedback signal in the LIGHT state, motor drive controller 64 directs a scanning assembly motor (not shown) to rotate the rack gear and increase the radial distance at which optical scanning assembly 44 is positioned, thereby to move optical scanning assembly 44 toward perimeter 46 of wafer 12.

Whenever optical scanning assembly 44 is positioned along slot 56 at a radial distance greater than that of perimeter 46, none of light beam 62 is reflected toward photodetector 54, which delivers a position feedback signal in a NO LIGHT state to scanning assembly motor drive controller 64. In response to the position feedback signal in the NO LIGHT state, motor drive controller 64 directs the scanning assembly motor to rotate the rack gear and reduce the radial distance at which optical scanning assembly 44 is positioned, thereby to move optical scanning assembly toward perimeter 46 of wafer 12.

Whenever optical scanning assembly 44 is positioned along slot 56 at a radial distance aligned with that of perimeter 46, a predetermined portion of light beam 62 is reflected toward photodetector 54, which delivers a position feedback signal in an ALIGNED state to scanning assembly motor drive controller 64. In response to the position feedback signal in the ALIGNED state, motor drive controller 64 maintains the radial distance at which optical scanning assembly 44 is positioned. As a result, the position feedback signal in the ALIGNED state is indicative of the radial position of perimeter 46 of wafer 12. The feedback circuit components are of such values that optical scanning assembly 44 tracks significant changes in the perimeter 46 of wafer 12 over relatively small angular displacements, such as those characteristic of a notch in the wafer.

A platform motor drive controller 66 controls a waist motor that rotates platform 20 and optical scanning assembly 44 about central axis 22. Platform motor drive controller 66 also delivers at regular time intervals a sampling control signal to a control input 68 of a sampling circuit 70. The regular time intervals correspond to unit incremental angular movements (e.g., one arc second, which is approximately 0.003 degrees) of platform 20 and optical scanning assembly 44. The sampling control signal corresponds, therefore, to an angular position of optical scanning assembly 44 relative to wafer 12.

A sample input 72 of sampling circuit 70 receives from scanning assembly motor drive controller 64 a position signal corresponding to the radial position of optical scanning assembly 44 in alignment with perimeter 46. In response to the sampling control signal received from platform motor drive controller 66, sampling circuit 70 samples the position signal delivered to input 72 from scanning assembly motor drive controller 64. The sampling control signal and corresponding position signal correspond, respectively, to the polar coordinates $\theta$ and $r$ of perimeter 46 of wafer 12.

During the edge scan about perimeter 46 of wafer 12, sampling circuit 70 transfers the polar coordinate data to a data storage means or circuit 82. After a complete edge scan about perimeter 46 (i.e., a scan of 360 degrees), data storage circuit 82 contains a complete polar coordinate map representing perimeter 46 of wafer 12.

Microprocessor 42 uses the polar coordinate map stored in data storage circuit 82 to determine the position of the center 84 of wafer 12 relative to central axis 22 and to determine the angular locations of a flat 86 (FIG. 2) and a notch 88 (FIG. 2) on perimeter 46. Flat 86 and notch 88 are standard features on a semiconductor wafer and are indicative of its orientation. Microprocessor 42 determines the location of center 84, flat 86, and notch 88 of wafer 12 to allow wafer handler 10 to correctly position wafer 12 on test apparatus 16. Typically, wafer handler 10 repositions wafer 12 so that its center 84 is aligned with central axis 22 prior to movement of wafer 12 to test apparatus 16. The polar coordinate map stored in data storage circuit 82 also allows wafer handler 10 to read bar code symbol 48 by rotating optical scanning assembly 44 past bar code symbol 48 (i.e., a bar code scan), as will be described in greater detail below.

Figure 4:
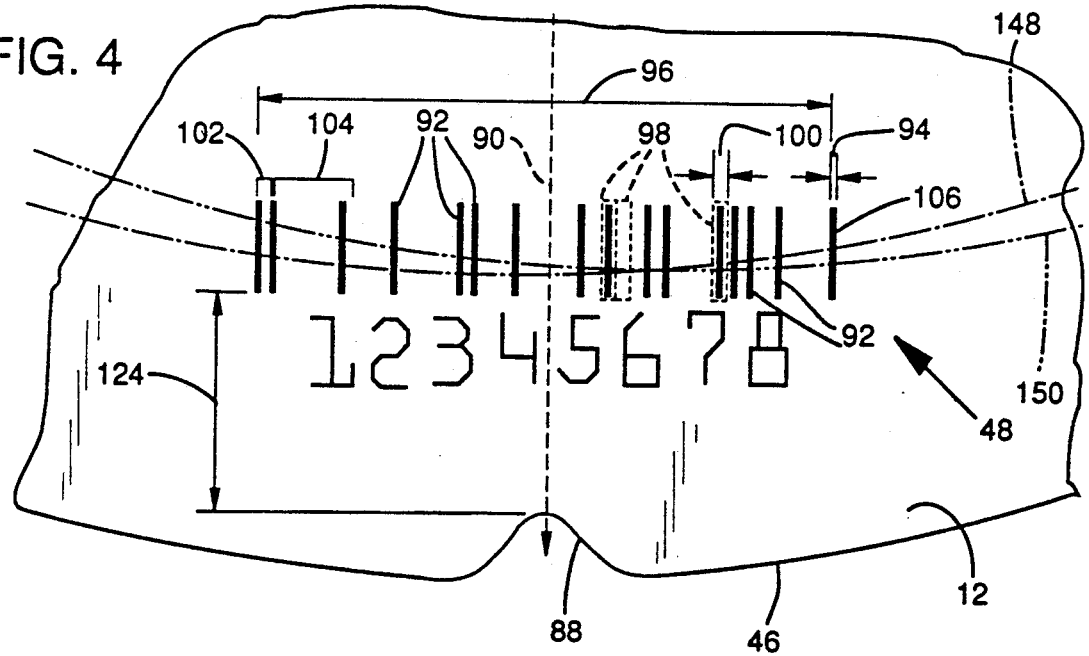
FIG. 4 is an enlarged diagram of a bar code symbol of a format type.

FIG. 4 is an enlarged diagram of bar code symbol 48 positioned on bottom side 50 of wafer 12. Bar code symbol 48 is bisected by a radial projection 90 that extends from the center 84 of wafer 12 and bisects notch 88. In a preferred embodiment, bar code symbol 48 includes multiple bars 92 of which each has a fixed bar width 94. In addition, bar code symbol 48 has a fixed bar code region of length 96 and a predetermined number of bar positions 98 of which each has a fixed width 100. As a result, bar code symbol 48 is of the "fixed width" type.

Each bar 92 is a laser scribe mark in the bottom surface of wafer 12. Such scribe marks decrease the reflectivity of wafer 12 and function, therefore, as lower reflective stripes that contrast with the higher reflective spaces between them. As a result, bars 92 and the spaces between them represent binary information in a manner similar to that contained in a conventional bar code symbol.

A sequence of five adjacent bar positions 98 constitutes a binary representation of a message character of the alphanumeric type. Since each bar position 98 may assume one of two states, each message character may represent one of thirty-two possible alphanumeric characters.

Table 1 shows the alphanumeric characters that can be rendered in the exemplary bar code symbol 48. Each message character in Table 1 is represented by a sequence of five digits in which the numerals 1 and 0 represent, respectively, the presence and absence of a bar 92 in a bar position 98. A message character is assigned to each numeric character (i.e., the numerals 0-9) and to each alphabet character except the letters B, I, N, and O.

TABLE 1

| Message Character | NUMERICAL VALUE | BINARY BAR CODE |
| --- | --- | --- |
| 0 | 00 | 00000 |
| 1 | 01 | 00001 |
| 2 | 02 | 00010 |
| 3 | 03 | 00011 |
| 4 | 04 | 00100 |
| 5 | 05 | 00101 |
| 6 | 06 | 00110 |
| 7 | 07 | 00111 |
| 8 | 08 | 01000 |
| 9 | 09 | 01001 |
| A | 10 | 01010 |
| C | 11 | 01011 |
| D | 12 | 01100 |
| E | 13 | 01101 |
| F | 14 | 01110 |
| G | 15 | 01111 |
| H | 16 | 10000 |
| J | 17 | 10001 |
| K | 18 | 10010 |
| L | 19 | 10011 |
| M | 20 | 10100 |
| P | 21 | 10101 |
| Q | 22 | 10110 |
| R | 23 | 10111 |
| S | 24 | 11000 |

TABLE 1-continued

| Message Character | NUMERICAL VALUE | BINARY BAR CODE |
|---|---|---|
| T | 25 | 11001 |
| U | 26 | 11010 |
| V | 27 | 11011 |
| W | 28 | 11100 |
| X | 29 | 11101 |
| Y | 30 | 11110 |
| Z | 31 | 11111 |

A bar code format of this type is called "binary bar code 32" and is comparatively space efficient because it employs only five bits for each message character. The elimination of the letters B, I, N, and O also reduces the incidence of transposition errors that can occur during a bar code scan.

Bar code symbol 48 includes eight message characters, a first pair of bars representing a START character 102, a check or parity character 104 that includes five bar positions 98, eight message characters, and a single bar 106 representing a STOP character. As a result, bar code symbol 48 includes a total of 43 bar positions 98 and begins with at least two bars and ends with at least one bar.

FIG. 5 is a flow diagram showing the process by which wafer handler 10 reads or decodes bar code symbol 48. With reference to FIGS. 3-5, process block 120 indicates that optical scanning assembly 44 performs an edge scan of wafer 12 to form a polar coordinate map of perimeter 46 of wafer 12.

Process block 122 indicates that scan data processing system 60 uses the polar coordinate map to determine the location of bar code symbol 48 along radial projection 90. Bar code symbol 48 is separated from notch 88 along radial projection 90 by a predetermined distance 124 (FIG. 4). Microprocessor 42 obtains from data storage circuit 82 the radius representing the apex of notch 88 and decreases the radius by an amount equal to the predetermined distance 124, thereby to determine the radial position of bar code symbol 48.

Process block 126 indicates that wafer handler 10 positions optical scanning assembly 44 along slot 56 in alignment with the computed radial position of bar code symbol 48.

Process block 128 indicates that optical scanning assembly 44 performs a bar code scan of bar code symbol 48 to obtain an angular mapping of the reflectance characteristics of bar code symbol 48. The mapping of the reflectance characteristics of bar code symbol 48 is obtained in a manner similar to that described above with reference to the edge scan of wafer 12, except that optical scanning assembly 44 is maintained at a fixed radial position. In addition, bars 92 and the spaces between them are represented by the state of the position feedback signal (e.g., NO LIGHT and LIGHT, respectively), which is delivered by motor drive controllers 64 to input 72 of sampling circuit 70. The data representing the polar coordinate map of bar code symbol 48 are transferred to data storage circuit 82.

Process block 130 indicates that microprocessor 42 computes the angular displacement $\Delta\theta$ between START character 102 and STOP character 106 of bar code symbol 48. Microprocessor 42 identifies START character 102 and STOP character 106 as the respective first and last decreases in reflectance detected during the bar code scan.

Process block 132 indicates that microprocessor 42 uses the angular displacement $\Delta\theta$ and the total number N of bar positions 98 (e.g., forty-three) in bar code symbol 48 to compute an estimated unit angular pitch $\Delta\theta_{pk}$ between possible next adjacent bars 92. In particular, microprocessor 42 computes the estimated unit angular pitch $\Delta\theta_{pk}$ as:

$$\Delta\theta_{pk} = \Delta\theta/(N-1),$$

in which the factor (N−1) represents the number of spaces between the N possible bars 92 in bar code symbol 48.

Process block 134 indicates that microprocessor 42 obtains from data storage circuit 82 the angular position $\theta_1$ corresponding to the first bar in START character 102 of bar code symbol 48. This angular position is designated the present angular position $\theta_k$.

Process block 136 indicates that microprocessor 42 obtains from data storage circuit 82 reflectance data corresponding to the next angular position $\theta_{k+1}$, which represents the next adjacent bar position 98. Microprocessor 42 identifies the angular position $\theta_{k+1}$ by the equation:

$$\theta_{k+1} = \theta_k + \Delta\theta_{pk}.$$

For example, whenever the present angular position $\theta_k$ is equal to $\theta_1$ and represents the first bar in START character 102, microprocessor 42 obtains from data storage circuit 82 the reflectance data corresponding to the next angular position $\theta_2$. The angular position $\theta_2$ corresponds to the second bar START character 102.

Decision block 138 represents an inquiry as to whether the reflectance data at or in the vicinity of the next angular position $\theta_{k+1}$ represent a bar 92. Whenever the reflectance data at or in the vicinity of the next angular position $\theta_{k+1}$ do not represent a bar (i.e., the data represent a bar position 98 without a bar 92), decision block 138 proceeds to process block 140. Whenever the reflectance data in the vicinity of the next angular position $\theta_{k+1}$ represent a bar, decision block 138 proceeds to process block 142.

Process block 140 indicates that the next angular position $\theta_{k+1}$ is designated the present angular position $\theta_k$. Process block 140 returns to process block 136.

Process block 142 indicates that processor 42 obtains from data storage circuit 82 the actual angular position $\theta_{k\ actual}$ of the detected bar 92.

Process block 144 indicates that the actual angular position $\theta_{k\ actual}$ of the detected bar is designated the present angular position $\theta_k$, thereby to provide a present angular position $\theta_k$ that corresponds to an actual bar position 98. This step functions, therefore, as a correction of the present angular position $\theta_k$.

Process block 146 indicates that microprocessor 42 computes a corrected unit angular pitch $\Delta\theta_{pk}$ as:

$$\Delta\theta_{pk} = (\theta_k - \theta_{notch})/([0.5 \times N] - K),$$

in which the factor $\theta_{notch}$ represents the angular position of notch 88 on perimeter 46 of wafer 12, and the factor K indicates that the detected bar 98 is located at the K-numbered bar position 98 in bar code symbol 48. The corrected unit angular pitch $\Delta\theta_{pk}$ is calculated, therefore, as the unit angular pitch between the detected bar 92 at its actual angular position $\theta_{k\ actual}$ (which has been designated $\theta_k$) and a bar position 98 aligned with radial projection 90 (i.e., $\theta_{notch}$). The factor $([0.5 \times N] - K)$ represents the number of bar positions 98 between the detected bar 92 and the bar position aligned with radial projection 90. Process block 146 returns to process block 136.

Process blocks 142 and 146 represent corrections of, respectively, the present angular position $\theta_k$ and the unit angular pitch $\Delta\theta_{pk}$ in accordance with the actual angular position $\theta_{k\ actual}$ of a detected bar 92. These corrections allow scan data processing system 60 to accurately decode bar code symbol 48 whenever it is scanned along a symmetrically positioned arcuate scan path 148 (FIG. 4) or a nonsymmetrically positioned arcuate scan path 150 (FIG. 4). Symmetrically positioned arcuate scan path 148 is formed whenever center 84 of wafer 12 is aligned with central axis 22 of wafer handler 10. Nonsymmetric arcuate scan path 150 is formed whenever center 84 of wafer 12 is not aligned with central axis 22 of wafer handler 10.

The process described above is directed primarily to a bar code format of the type shown in FIG. 4. In particular, the bar code format employs bars of a fixed width and spaces that are integer multiples of a unit spacing. The method and apparatus of this invention are also compatible, however, with a conventional bar code format employing bars and spaces of variable widths.

For example, such a bar code symbol may be decoded by computing determining from an arcuate scan path the widths of the bars and spaces along a straight line (i.e., the straight-line widths). In particular, the straight-line width of a bar may be represented as the chord of the arcuate scan path across the bar. The width w of such a chord may be represented as:

$$w = r \times \sin(\Delta\theta_k),$$

in which r represents the radial position of the optical scanning assembly during the bar code scan and $\Delta\theta_k$ is the angular displacement across the bar.

The method and apparatus of this invention are also compatible with mechanical transport systems that employ, for example, straight-line motion with changing speeds. In connection with such a system, the scan data processing system determines the speed at which portions of the bar code symbol are scanned. Each of the different portions of the bar code symbol is decoded in accordance with a corresponding unit velocity component of the different speeds. In the preferred embodiment described above, for example, the unit velocity component corresponds to a unit angular pitch representing a change in direction of the scan path.

It will be obvious to those having skill in the art that many changes may be made in the above-described details of the preferred embodiment present invention without departing from the underlying principles thereof. The scope of the present invention should, therefore, be determined only by the following claims.

We claim:

1. A bar code scanner for decoding a bar code symbol including a sequence of alternating bars and spaces of widths that represent a message, the bars and spaces being characterized by differences in light reflectivities, comprising:

light emitting means for emitting a light beam of preselected intensity for reflection by the bar code symbol;

scanning means for scanning the light beam across the bar code symbol in an arcuate path defined by an angular displacement about a rotational axis, the reflected light beam being intensity modulated in response to the difference in the reflectivities of the bars and spaces;

light detecting means receiving the reflected light beam for generating a reflectance signal corresponding to the intensity modulation of the reflected light beam and indicative of the relative positions of the bars and spaces along the arcuate path; and computing means responsive to the reflectance signal for deriving as integer multiples of a unit angular displacement the widths that represent the message, thereby determining the sequence of bars and spaces in the bar code symbol.

2. The scanner of claim 1 in which the scanning means includes rotation means for rotating the light beam relative to the bar code symbol to scan the light beam along the arcuate scan path across the bar code symbol.

3. The scanner of claim 1 in which the bar code symbol includes bars of a uniform width and spaces that are integer multiples of a unit spacing distance, and in which the widths of the spaces represent the message.

4. A bar code scanner for decoding a bar code symbol including a sequence of alternating bars and spaces characterized by differences in light reflectivities, comprising:

light emitting means for emitting a light beam of a preselected intensity for reflection by the bar code symbol;

scanning means for scanning the light beam at plural velocities across the bar code symbol, the scanning means including rotation means for providing rotational motion between the light beam and the bar code symbol to scan the light beam across the bar code symbol along an arcuate scan path that is characterized as plural scan paths of different directions that correspond to different velocities, the light beam being intensity modulated corresponding to the different reflectivities of the bars and spaces;

light detecting means receiving the light reflected from the bar code symbol for generating a reflectance signal corresponding to the intensity modulation of the reflected light beam and indicative of the relative positions of the bars and spaces;

mapping means in communication with the scanning means and the light detecting means for correlating the reflectance signal with the plural velocities at which the light beam is scanned across the bar code symbol; and computing means in communication with the mapping means for computing a unit velocity component representing a component of the velocity at which the light beam is scanned between preselected ones of the plural bars and spaces, and for reviewing the reflectance signal in accordance with the unit velocity component to determine the sequence of bars and spaces in the bar code symbol.

5. The scanner of claim 4 in which the arcuate scan path is formed by providing an angular displacement of one of the light emitting means and the bar code symbol about a rotational axis, in which the mapping means correlates the reflectance signal with the angular displacement, and in which the unit velocity component represents a unit angular pitch between preselected ones of the plural bars and spaces.

6. The scanner of claim 4 in which the bar code symbol is of a fixed width type.

7. The scanner of claim 4 in which the bar code symbol includes bars of a uniform width and spaces that are integer multiples of a unit spacing distance.

8. A method of decoding a bar code symbol including a sequence of alternating bars and spaces characterized by different reflectivities, comprising:

directing a light beam of a preselected intensity toward the bar code symbol to be reflected from it;

scanning the light beam at plural velocities across the bar code symbol, the light beam being intensity modulated corresponding to the different reflectivities of the bars and spaces;

generating a reflectance signal corresponding to the intensity modulation of the reflected light beam;

correlating the reflectance signal with the plural velocities at which the light beam is scanned across the bar code symbol;

computing a unit velocity component representing a component of the velocity at which the light beam is scanned between preselected ones of the plural bars and spaces;

detecting a difference between the sequence of bars and spaces in the reflectance signal and the sequence determined by the unit velocity component and correcting the unit velocity component to eliminate the difference; and reviewing the reflectance signal in accordance with the unit velocity component to determine the sequence of bars and spaces in the bar code symbol.

9. The method of claim 8 in which the step of scanning the light beam at plural velocities includes scanning the light beam in an arcuate scan path across the bar code symbol, the arcuate scan path being characterized as plural scan paths of different directions that correspond to different velocities.

10. In a bar code scanner for decoding a bar code symbol including a sequence of alternating bars and spaces characterized by differences in light reflectivities, the bars being positioned at selected ones of multiple predefined bar positions and the scanner including means for scanning the bar code symbol along an arcuate path defined by an angular displacement about a rotational axis, a method of decoding the bar code symbol, comprising:

computing an initial estimated angular pitch of the bar positions in the bar code symbol;

determining in accordance with the initial estimated angular pitch the bar position at which a first bar is positioned in the bar code symbol;

obtaining an actual angular position of the first bar in the bar code symbol;

computing a corrected estimated angular pitch in accordance with the actual angular position of the first bar; and determining in accordance with the corrected estimated angular pitch the bar position at which a second bar is positioned in the bar code symbol.

11. The method of claim 10 in which the bar code symbol includes a predetermined number of bar positions and the step of computing the initial estimated angular pitch includes dividing the angular displacement of the bar code symbol by the predetermined number of bar positions.

12. The method of claim 10 in which each of the bars in the bar code symbol has an actual angular position, the method further comprising determining the actual angular positions of all the bars in the bar code symbol and storing the actual angular positions, the step of obtaining the actual angular position of the first bar including retrieving its actual angular position from storage.

13. The method of claim 10 further comprising determining the bar positions of multiple bars succeeding the second bar in the bar code symbol.

14. The method of claim 13 in which the bar position of each of the multiple bars succeeding the second bar is determined in accordance with a corresponding corrected estimated angular pitch, the method further comprising:

obtaining for each of the multiple bars an actual angular position of an immediately preceding bar in the bar code symbol; and computing for each of the multiple bars the corresponding corrected angular pitch in accordance with the actual angular position of the immediately preceding bar.

* * * * *

UNITED STATES PATENT AND TRADEMARK OFFICE
CERTIFICATE OF CORRECTION

PATENT NO. : 5,015,832

DATED : May 14, 1991

INVENTOR(S) : Paul S. Filipski and Paul E. Bacchi

It is certified that error appears in the above-identified patent and that said Letters Patent is hereby corrected as shown below:

Column 3, line 33, change "a format" to --a preferred format--.

Signed and Sealed this

Eighth Day of September, 1992

Attest:

DOUGLAS B. COMER

Attesting Officer

Acting Commissioner of Patents and Trademarks